United States Patent
Yurugi et al.

(10) Patent No.: US 12,004,271 B2
(45) Date of Patent: Jun. 4, 2024

(54) POWER CONTROL DEVICE AND POWER CONTROL METHOD

(71) Applicant: RKC INSTRUMENT INC., Tokyo (JP)

(72) Inventors: Norikazu Yurugi, Tokyo (JP); Tetsuya Murata, Tokyo (JP)

(73) Assignee: RKC INSTRUMENT, INC., Tokyo (JP)

( * ) Notice: Subject to any disclaimer, the term of this patent is extended or adjusted under 35 U.S.C. 154(b) by 584 days.

(21) Appl. No.: 17/416,564

(22) PCT Filed: Jun. 28, 2019

(86) PCT No.: PCT/JP2019/025874
§ 371 (c)(1),
(2) Date: Jun. 21, 2021

(87) PCT Pub. No.: WO2020/136958
PCT Pub. Date: Jul. 2, 2020

(65) Prior Publication Data
US 2022/0086958 A1    Mar. 17, 2022

(30) Foreign Application Priority Data
Dec. 25, 2018 (WO) ................. PCT/JP2018/047469

(51) Int. Cl.
*G01R 19/165* (2006.01)
*G05F 1/66* (2006.01)
(Continued)

(52) U.S. Cl.
CPC ......... *H05B 3/0019* (2013.01); *G01R 19/165* (2013.01); *G05F 1/66* (2013.01); *H05B 3/22* (2013.01)

(58) Field of Classification Search
None
See application file for complete search history.

(56) References Cited

U.S. PATENT DOCUMENTS 5,122,968 A * 6/1992 Bauer .................. F02P 19/023
219/486
5,208,485 A * 5/1993 Krinsky .................... H02J 1/10
307/41
(Continued)

FOREIGN PATENT DOCUMENTS

JP    H04-78796 U    7/1992
JP    2003-178855 A    6/2003
(Continued)

OTHER PUBLICATIONS

International Search Report dated Aug. 13, 2019, for International Application No. PCT/JP2019/025874, 1 page.

*Primary Examiner* — Thomas J. Hiltunen
(74) *Attorney, Agent, or Firm* — FROST BROWN TODD LLP

(57) ABSTRACT

Provided is a power control device 100 comprising: a current detector 31 that measures a combined current value obtained by combining currents flowing through a plurality of loads 1-4; and an output calculation unit 11 that calculates a correction value obtained by dividing a total value of products of operation output values for the loads 1-4 and rated current values of the loads 1-4, respectively, by the combined current value obtained by the current detector 31, and that performs power supply control for the loads 1-4 on the basis of a corrected operation output value that is a product of the operation output value and the correction value for each of the loads 1-4, in which in a system that heats or cools a workpiece by means of a plurality of loads, heating control or cooling control can be performed in which an effect of a fluctuation in load characteristics is reduced.

6 Claims, 4 Drawing Sheets

(51) Int. Cl.
*H05B 3/00* (2006.01)
*H05B 3/22* (2006.01)

(56) References Cited

U.S. PATENT DOCUMENTS

| | | | | |
|---|---|---|---|---|
| 5,550,449 A | * | 8/1996 | Ege | G05B 24/02 |
| | | | | 318/632 |
| 5,836,156 A | * | 11/1998 | Watabe | G01R 31/2829 |
| | | | | 60/276 |
| 8,283,608 B2 | * | 10/2012 | Naydenov | B01D 53/9431 |
| | | | | 219/486 |
| 8,710,406 B2 | * | 4/2014 | Sanders | H02J 3/14 |
| | | | | 307/31 |
| 9,570,923 B2 | * | 2/2017 | Nomura | H02J 7/0016 |
| 11,482,853 B2 | * | 10/2022 | Subotski | H02H 3/08 |
| 2011/0245988 A1 | * | 10/2011 | Ingels | H02J 3/0073 |
| | | | | 700/295 |
| 2022/0163567 A1 | * | 5/2022 | Krupar | H03K 17/0822 |

FOREIGN PATENT DOCUMENTS

| JP | 2013-255542 A | 12/2013 |
|---|---|---|
| WO | WO 2017/109954 A1 | 8/2018 |

* cited by examiner

POWER CONTROL DEVICE AND POWER CONTROL METHOD

TECHNICAL FIELD

This invention relates to a power control device and a power control method for controlling power supply to each of a plurality of loads in a system for heating or cooling a workpiece by the plurality of loads.

BACKGROUND ART

A heating load such as a heater and a cooling load such as a Peltier element are used to heat and cool various workpieces. Coping with variations in load characteristics, etc. is one of the elements for more accurate heating or cooling using a load. Namely, even when the load characteristics, etc. vary, it is desired to remove or reduce an influence of the variation of the load characteristic, etc. to obtain an accurate output.

As a technique associated therewith, Patent Document 1 discloses a technique of a rice cooker for improving erroneous determination of an amount of cooked rice by a change in heat amount generated by variation in a heater or variation in a power supply voltage.

PRIOR ART DOCUMENT

Patent Document

Patent Document 1
Japanese Patent Application Publication 2013-255542

SUMMARY OF THE INVENTION

Problem to be Solved by the Invention

Some systems are provided with multiple loads for heating or cooling.

In order to cope with variation of load characteristics by the conventional technique as Patent Document 1 in such a system, it is necessary to provide a plurality of current detectors to measure a current value of each load, also causing complicated control processing.

In view of the foregoing, it is an object of this invention to provide a power control device and a power control method capable of performing an output operation in which an influence of variations in load characteristics is reduced by a relatively simple configuration in a system for heating or cooling a workpiece by a plurality of loads.

Means for Solving the Problem (Configuration 1)

A power control device for controlling power supply to each of a plurality of loads in a system for heating or cooling a workpiece by the plurality of loads, the power control device including:
  a current detector for measuring a combined current value in which currents flowing through the plurality of loads are combined; and
  an output calculation unit for calculating a correction value which is a value obtained by dividing a total value of a product of an operation output value for each of the loads and each rated current value of each of the loads by a combined current value obtained by the current detector, and controlling power supply to each of the loads based on a corrected operation output value which is a product of an operation output value for each of the loads and the correction value.

(Configuration 2)

The power control device according to Configuration 1, in which an update process for updating the correction value is performed by a product of the correction value of a cycle before an applied cycle and a predetermined value for each predetermined cycle.

(Configuration 3)

The power control device according to Configuration 2, in which the predetermined value is a value obtained by dividing a total value of a product of an operation output value for each of the loads and each rated current value of each of the loads by a combined current value obtained by the current detector.

(Configuration 4)

The power control device according to Configuration 2, in which the predetermined value is a value obtained by adding 1 to a product of a ratio of increase and decrease of the correction value and an adjustment factor.

(Configuration 5)

The power control device according to Configuration 2, in which the predetermined value is a sum of a value obtained by multiplying, by an adjustment factor, a value obtained by dividing a total value of a product of an operation output value for each of the loads and each rated current value of each of the loads by a combined current value obtained by the current detector, and a complement to the adjustment factor.

(Configuration 6)

The power control device according to any of Configurations 2 to 5, in which when a variation amount of the combined current value exceeds a predetermined value, the correction value is not updated.

(Configuration 7)

The power control device according to any of Configurations 2 to 6, in which when a correction value calculated by the update process is not within a predetermined range, the correction value is not updated or a limit is set on the correction value.

(Configuration 8)

The power control device according to any of Configurations 2 to 7, in which a moving average is calculated using a plurality of the correction values of a past cycle, and a value that is calculated is set as a correction value of an applied cycle.

(Configuration 9)

A power control method for controlling power supply to each of a plurality of loads in a system for heating or cooling a workpiece by the plurality of loads, the power control method including the steps of:
  measuring a combined current value in which currents flowing through the plurality of loads are combined;
  calculating a correction value which is a value obtained by dividing a total value of a product of an operation output value for each of the loads and each rated current value of each of the loads by the combined current value; and
  controlling power supply to each of the loads based on a corrected operation output value which is a product of an operation output value for each of the loads and the correction value.

Effect of the Invention

According to the power control device of this invention, in a system for heating or cooling a workpiece by a plurality of loads, it is possible to realize an output operation in which an influence of variations in load characteristics is reduced by a relatively simple configuration.

BRIEF DESCRIPTION OF THE DRAWINGS

FIG. 4 is a diagram showing a test result in which the correction processing function regarding the power control device of the embodiment is turned on.

EMBODIMENTS FOR CARRYING OUT THE INVENTION

The embodiments of this invention are described concretely below together with the drawings. The embodiments given below are some of the embodiments upon embodying this invention and are not intended to limit the invention within such a scope.

Embodiment 1

Figure 1:
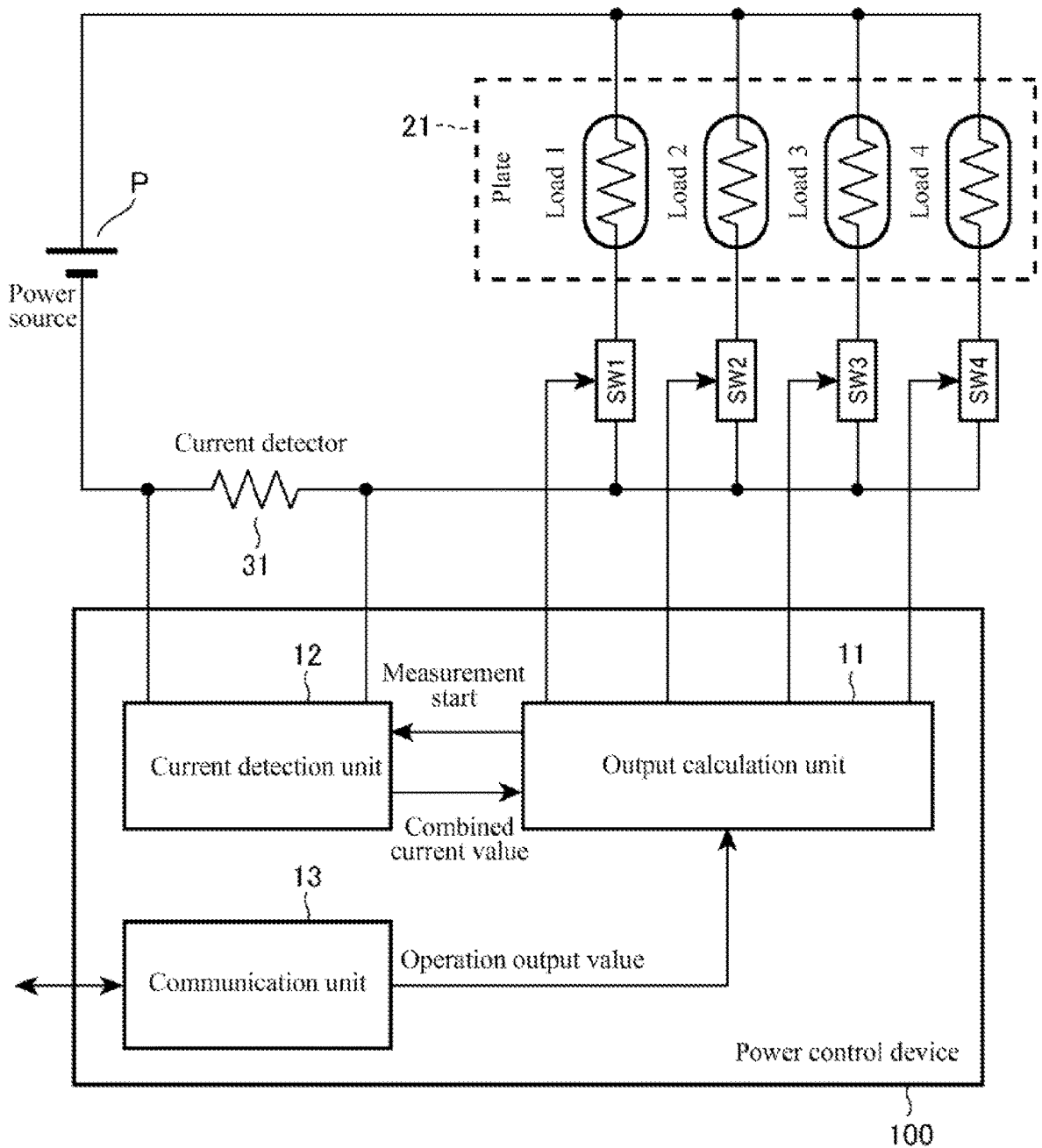
FIG. 1 is a block diagram schematically illustrating a configuration regarding this invention of a heating system of an embodiment of this invention.

FIG. 1 is a block diagram schematically showing a configuration relevant to this invention of the system according to this embodiment.

The system of this embodiment is for heating a workpiece (not specifically shown) loaded on a plate 21, which is configured to have four heaters (load 1 to load 4) embedded in the plate 21. Namely, the system heats the workpiece loaded on the plate by a plurality of heaters. The plate 21 is formed of a material having a high thermal conductivity, and the load 1 to load 4 are thermally connected.

The system of this embodiment is provided with a plate 21 in which loads 1 to 4 are embedded, a DC power source P for supplying power to each load, switching elements SW1 to SW4 for turning on/off power supply to each load, a current detector 31 provided on a power supply path from the DC power source P to each load, and a power control device 100 for controlling power supply to each load by ON/OFF control of each switching element.

Each load is connected in parallel to the DC power source P, and the current detector 31 serving as a current detection resistor is provided on a power supply path between the DC power source P and a parallel connection circuit of each load. Therefore, the current detector 31 is a current detector that measures a combined current value where the currents flowing through all the load 1 to load 4 are combined.

The power control device 100 receives an input of an operation output value MV from other devices such as a temperature controller and performs ON/OFF control of the switching elements SW1 to SW4 by PWM control based on the operation output value MV, which is provided with an output calculation unit 11 for performing various calculation processes such as PWM control; a current detection unit 12 which obtains a combined current value i where currents flowing from a current detector 31 to the load 1 to load 4 are combined; and a communication unit 13 which transmits/receives information to/from other devices such as a temperature controller.

The distinction of the load 1 to load 4 is hereinafter referred to as "channel", and the operation output value corresponding to the channel 1 is referred to as MV(1), and the operation output value corresponding to the channel ch is referred to as MV(ch), etc.

The system of this embodiment heats a workpiece loaded on the plate 21, where the resistance values of the load 1 to load which are heaters are temperature-dependent, and the resistance values increase as the temperature rises. Thus, for example, even if the operation output value MV(ch) is constant at 80%, the actual power that is output is reduced when the temperature is higher than when the temperature is low. This is because the current value decreases due to an increase in the resistance value. Namely, for example, although it is primarily desired to output 80% power, 80% output cannot actually be obtained when the temperature rises.

To solve the problem, the basis of the power control device 100 of this embodiment is calculating a correction value mc which is a value obtained by dividing a total value of a product of each operation output value MV(ch) and each rated current value I(ch) of each load by a combined current value i obtained by the current detector 31 (Equation 1), and based on a corrected operation output value which is a product of each operation output value MV(ch) and the correction value mc, controlling power supply of each channel, whereby a deviation of output power caused by a change in a resistance value of each load is corrected to approach an appropriate value.

$$mc = \frac{\sum \{MV(ch) \times I(ch)\}}{i} \quad \text{[Equation 1]}$$

A total value of a product of each operation output value MV(ch) and each rated current value I(ch) indicated by the numerator of Equation 1 corresponds to a composite value of a current to be flown to each load by controlling an output, namely, a target combined current value.

On the other hand, the denominator i of Equation 1 is the actually measured combined current value.

Namely, the correction value mc is a ratio of the target combined current value and the actually measured combined current value.

In the power control device 100 of this embodiment, the combined current value i is acquired from the current detector 31 for each control cycle, and a correction value used in the next cycle is calculated and updated. The correction value $MC_{n+1}$ used in the next cycle is calculated, using the above basic concept, by a product of a total value of a product of each operation output value $MV(ch)_n$ and each rated current value I(ch) in the current cycle divided by the combined current value $i_n$ obtained by the current detector 31 and the correction value $MC_n$ used in the current cycle, as shown in Equation 2. Namely, the correction value $MC_{n+1}$ of the next cycle is obtained by multiplying the correction value $MC_n$ of the current cycle by the newly calculated correction value mc.

$$MC_{n+1} = \frac{\sum \{MV(ch)_n \times I(ch)\}}{i_n} \times MC_n \quad \text{[Equation 2]}$$

In Equation 2, the distinction of data for each control cycle is represented by subscripts n or n+1. The same representation will be used hereafter.

Figure 2:
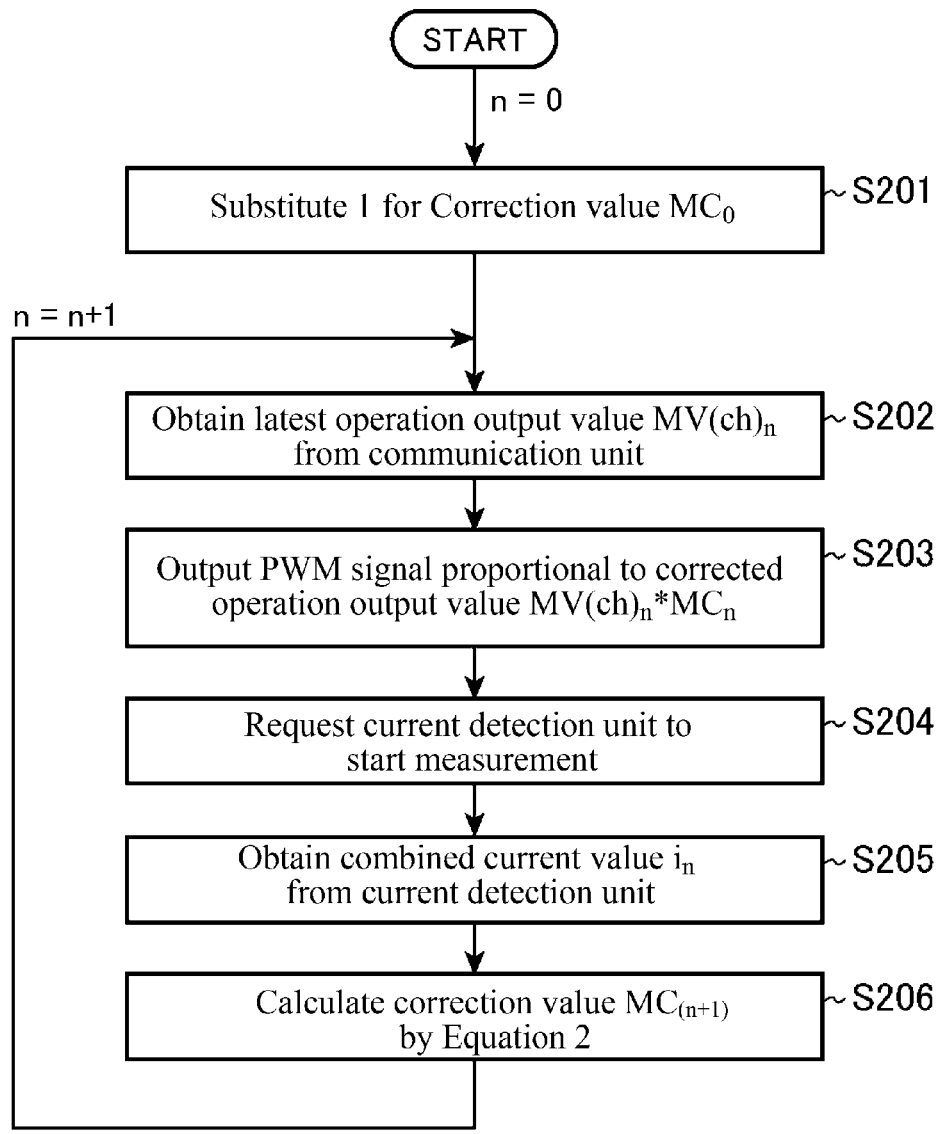
FIG. 2 is a flowchart outlining a processing operation of the power control device of the embodiment.

Next, an outline of the processing operation of the part related to this invention of the power control device 100 of this embodiment will be described with reference to FIG. 2.

As an initialization process, 0 is substituted for n, and in step 201, 1 is substituted for the correction value $MC_n$ (i.e., $MC_0$) in the output calculation unit 11.

In the subsequent step 202, the output calculation unit 11 performs a process of acquiring each operation output value $MV(ch)_n$ from the communication unit 13. This is to acquire each operation output value $MV(ch)_n$ corresponding to each load from other devices such as a temperature controller.

In step 203, the output calculation unit 11 calculates a PWM signal that is proportional to a product of each operation output value $MV(ch)_n$ and the correction value $MC_n$ (corrected operation output value), and performs ON/OFF control of each switching element SW(ch) by the PWM signal. Since $MC_0=1$ applies in the case of cycle n=0, the initial value $MV(ch)_0$ of each operation output value obtained from the communication unit 13 is used as it is.

In steps 204 and 205, the output calculation unit 11 allows the current detection unit 12 to measure the current, thereby acquiring the combined current value $i_n$.

In the subsequent step 206, the output calculation unit 11 performs the calculation based on Equation 2 and calculates the correction value $MC_{n+1}$ of the next cycle. The rated current value I(ch) of each load is preset in the device by being set as of the shipment of the device or input by a user.

After calculating the correction value $MC_{n+1}$ in step 206, n is incremented, and the process returns to step 202 to repeat the above process.

Figure 3:
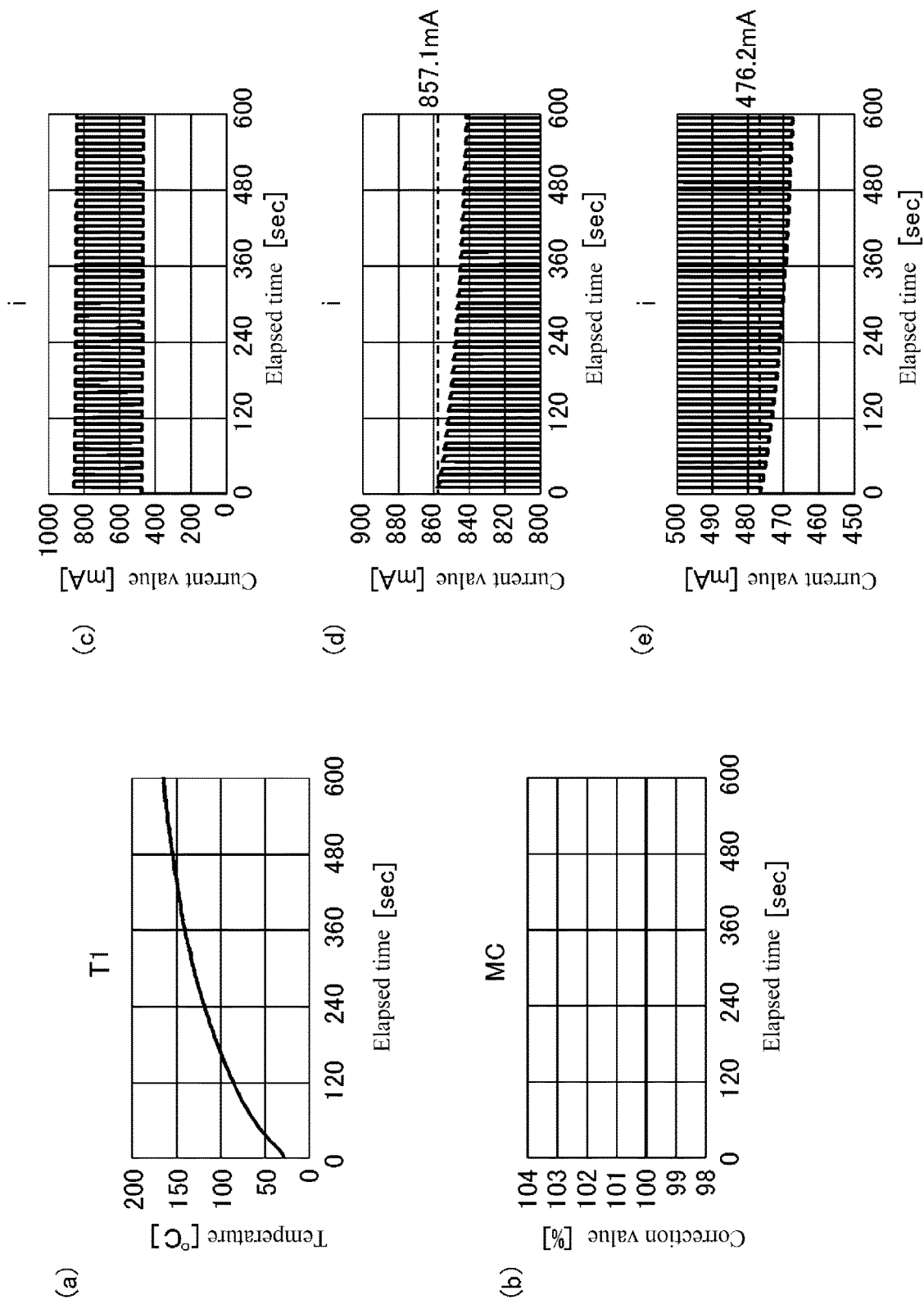
FIG. 3 is a diagram showing a test result in which the correction processing function regarding the power control device of the embodiment is turned off.
Figure 4:
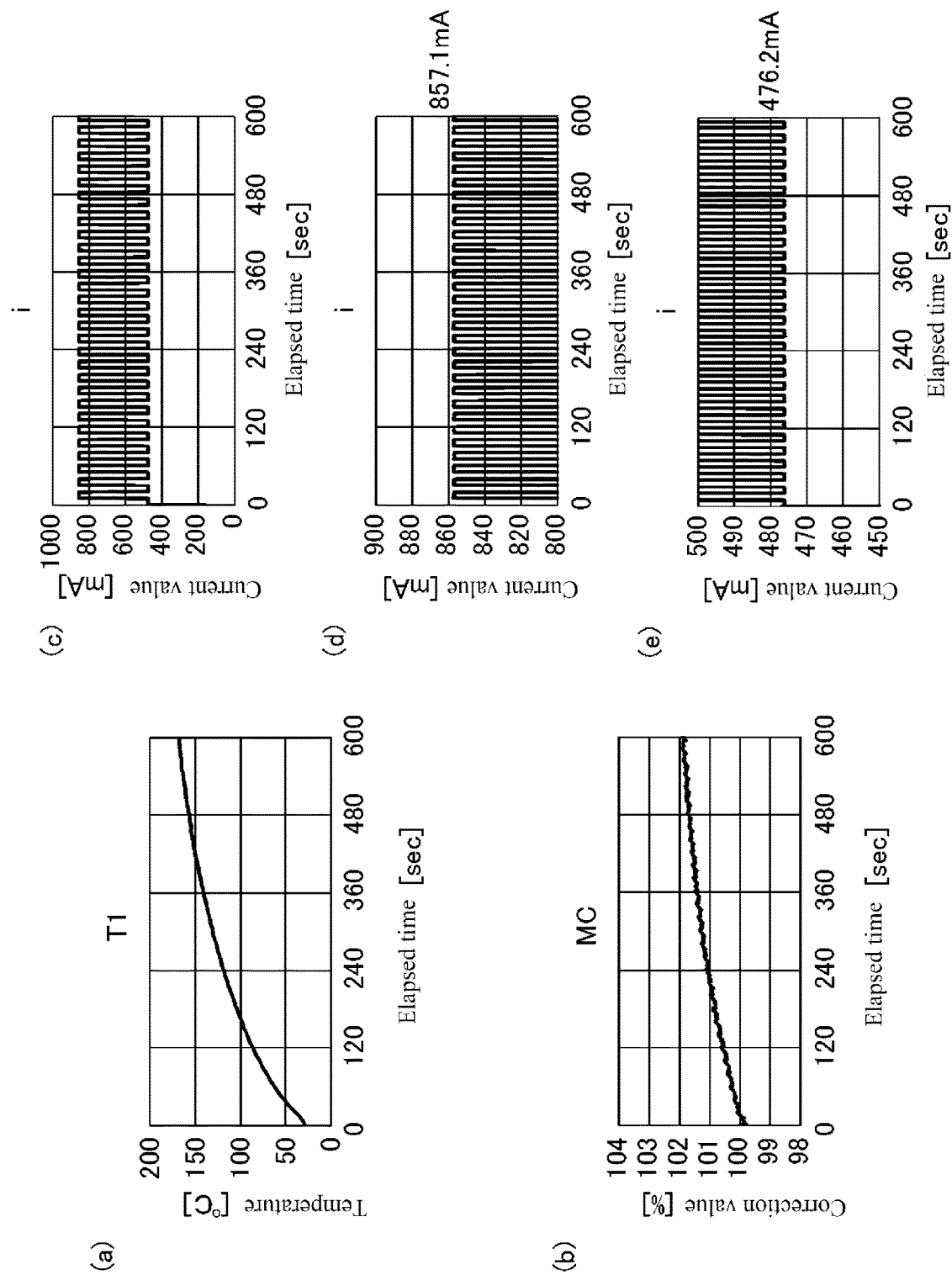

FIGS. 3 and 4 show the results of a comparative test in the power control device 100 of this embodiment where the correction processing function for the operation output value MV using the correction value MC described above is turned off and turned on.

This test was conducted by setting the operation output value MV(ch) in the power control device 100 as follows.

MV(1): 10% and 90% changed approximately every 10 seconds
MV(2): 20% fixed
MV(3): 50% fixed
MV(4): 20% fixed FIG. 3 is a graph showing a result when the correction processing function is turned off, and FIG. 4 is a graph showing a result when the correction processing function is turned on.

The graphs (a) in FIGS. 3 and 4 are graphs showing a measured temperature T1 obtained from a temperature sensor placed near the center of the plate 21 in the test.

The graphs (b) in FIGS. 3 and 4 are graphs showing the change state of the actually calculated correction value $MC_D$. When the correction processing function is off, the correction value is identical as constantly being 1 (100%) as shown in FIG. 3(b).

The graphs (c) of FIGS. 3 and 4 are graphs showing the combined current values measured by the current detector 31.

The graphs (d) of FIGS. 3 and 4 are enlarged views of the graphs (c) of FIGS. 3 and 4 at around 860 mA (near maximum current value).

The graphs (e) of FIGS. 3 and 4 are enlarged views of the graphs (c) of FIGS. 3 and 4 at around 480 mA (near minimum current value).

As understood from FIGS. 3 and 4, when the correction processing function is turned off (FIGS. 3(c)-(e)), the current value decreases with the elapsed time. Namely, as the temperature rises with the lapse of time and the resistance value of each load increases, the current value decreases.

On the other hand, in the case where the correction processing function is turned on (FIGS. 4(c)-(e)), there is no drop in the current value as seen in the case where the correction processing function is turned off, and therefore, shows that the output is maintained as intended.

As described above, according to the power control device 100 of this embodiment, in a system for heating a workpiece by a plurality of loads, variation in the load characteristics due to temperature change is prevented from affecting the output. The function can be realized by a simple configuration. Namely, according to this embodiment, only one current detector is required even if a plurality of loads is provided, which can be realized by a simple configuration. Those originally provided in the device for other purposes such as disconnection detection can be used as the configurations such as the current detector 31 and the current detection unit 12, and therefore, the function can be realized at a low cost.

Embodiment 2

As Embodiment 2, a method of allowing changes in a correction intensity in the system of Embodiment 1 will be described.

Since the basic concept is the same as Embodiment 1, overlapping description is omitted, and the points that differ from Embodiment 1 are mainly described below.

In the power control device of Embodiment 1, the correction is performed only by a ratio of a target combined current value and an actually measured combined current value (correction value mc of Equation 1). On the other hand, the power control device according to this embodiment can change a correction intensity by using an adjustment factor together with the correction value mc. Explanation on the configuration of the power control device is omitted herein for being identical to the power control device 100 of Embodiment 1.

In the power control device of this embodiment, the correction value MC is calculated and updated by the following Equation 3 using an adjustment factor α. Namely, in the process of step 206 in FIG. 2, the correction value $MC_{n+1}$ is calculated based on Equation 3 instead of Equation 2.

$$MC_{n+1} = MC_n + MC_n \times \left\{ \frac{\sum (MV(ch)_n \times I(ch))}{i_n} - 1 \right\} \times \alpha \qquad \text{[Equation 3]}$$

The adjustment factor α has a value between 0 and 1, which is preset in the device by being set as of the shipment of the device or input by a user.

For example, when mc (Equation 1) is 10/9, the correction value $MC_{n+1}$ is 1.111 times the correction value $MC_n$ in Equation 2 of Embodiment 1; on the other hand, {1+(0.111) α} times in Equation 3. Namely, the correction intensity can be arbitrarily set by the ratio of increase and decrease of the correction value (increase of 0.111 in the above example) and the adjustment factor α which takes a value between 0 and 1.

This is useful when the correction amount for each control cycle needs to be suppressed, etc.

When α is 1, the result is the same as Embodiment 1, and when α is 0, the correction operation is not performed.

Equation 3 denotes a process in which a product of the correction value $MC_n$ and "predetermined value" is set to the correction value $MC_{n+1}$ of the next cycle, in which "predetermined value" is "a value where 1 is added to the product of the ratio of increase and decrease of the correction value and the adjustment factor".

The following Equation 4 is obtained by modifying Equation 3.

$$MC_{n+1} = \left\{ \alpha \times \frac{\sum (MV(ch)_n \times I(ch))}{i_n} + (1-\alpha) \right\} \times MC_n \qquad \text{[Equation 4]}$$

Since the adjustment factor α takes a value between 0 and 1, (1−α) is a complement of the adjustment factor α.

Accordingly, Equation 4 (i.e., Equation 3) indicates that, in the process of setting the product of the correction value $MC_n$ and "predetermined value" as the correction value $MC_{n+1}$ of the next cycle, "predetermined value" is "a sum of the total value of the product of each operation output value MV(ch) and each rated current value I(ch) of each load, divided by the combined current value i obtained by the current detector 31, multiplied by the adjustment factor α, and the complement to the adjustment factor α".

While Equation 3 (and Equation 4 as its modification) is used herein as an example, this invention is not limited thereto, and any of those may be used which "update the correction value MC using an adjustment factor that allows the correction intensity to change by the correction value mc".

In each embodiment, the load is a heater basically for temperature rise control; however, cooling control using a cooling element, etc. may be applied.

A semiconductor device such as a Peltier device shows a characteristic where the current value increases as the temperature rises; however, the concept described in each embodiment can be applied as it is.

While each embodiment exemplifies those using a DC power source as the power source, this invention can also be applied to an AC power source.

While each embodiment exemplifies those where the correction value updating process is performed every control cycle of the power supply control, this invention is not limited thereto, and the correction value updating process may be performed at an arbitrary timing. However, when the temperature change of the load is quick, it is preferable to shorten the interval between update cycles or update timings.

Further, the correction value may not be updated under a predetermined condition. For example, when α variation amount of the calculated correction value (difference between $MC_{n+1}$ and $MC_n$) or a variation amount of the combined current value (e.g., difference between $i_n$ and $i_{n-1}$) exceeds a predetermined value, the correction value may not be updated.

Further, the range of application of the correction value may be limited (e.g., 0.8 to 1.2) in consideration of the temperature characteristic of the load.

Further, in order to prevent the correction values from varying more than necessary, moving average values may be calculated by using the calculated correction values MC of a plurality of cycles (e.g., correction values $MC_{n-3}$ to $MC_{n+1}$ for the last 5 cycles), and used as the latest correction value $MC_{n+1}$. At this stage, the moving average value may be replaced as the latest correction value $MC_{n+1}$, or the correction value $MC_{n+1}$ itself may be left unchanged and the power supply to the load may be controlled by the corrected operation output value obtained by multiplying the moving average value by the operation output value.

Instead of a simple moving average, a weighted average, etc. may be applied in which a more recent cycle is weighted, and the average value may be calculated by various calculation methods.

In the system of each embodiment, since the temperature change of the plate or the workpiece is relatively moderate, a rapid temperature change hardly occurs, and therefore, the correction value does not change rapidly under normal processing. By these processes, it is possible to suppress the hypersensitive reaction of the correction value to the effect of noise, etc.

In the above process, when the state where a variation amount of the correction value is large or the state where the correction value does not exist in the predetermined range continues for a predetermined number of times or a predetermined period of time or more, alarm information may be outputted to stop the output operation of power to the load.

When the operation output value is equal to or less than the predetermined value or when the combined current value obtained by the current detector is equal to or less than the predetermined value, an initial value may be used as the correction value or the correction processing function may be automatically turned off. Thus, the problem can be reduced that the correction value excessively reacts when the measurement resolution of the combined current value in is low. The initial value of the correction value may not be 1 (100%), and may be an arbitrary value such as 0.8 or 1.2, or a set value that can be inputted by a user.

While each embodiment exemplifies those where the rated current value I(ch) of each load is preset in the device, those may be used where the rated resistance value R(ch) of each load and the rated voltage value V of the power source are preset in the device such as by being set as of the shipment of the device or input by a user, and the rated current value I(ch) is calculated by dividing the rated voltage value V by the rated resistance value R(ch). Further, in order to reduce a memory required for the operation of a microcomputer, etc., the rated current value I(ch) and the rated resistance value R(ch) may be set to values common to all channels (e.g., rated current value I, rated resistance value R).

While the power control device has been described in each embodiment as including an output calculation unit 11, a current detection unit 12, and a communication unit 13, each functional unit is not limited to being individually configured as hardware, and all functions may be implemented as software on one device such as a microcomputer, etc. Conversely, any or all of the respective functional units may be implemented in hardware (through dedicated circuit, etc.), and a part or all of the functions described as processing executed in software on the output calculation unit 11 in the respective embodiments may be implemented in hardware.

While each embodiment exemplifies those where the correction value $MC_{n+1}$ of the cycle n+1, which is the next cycle, is calculated based on the correction value $MC_n$ used in the cycle$_n$ and the correction value mc (and the adjustment factor α) newly calculated in the cycle$_n$, this invention is not limited thereto. For example, the correction value $MC_n$ used in the cycle$_n$ may be calculated based on the correction value MC$_{n-1}$ of the previous cycle and the correction value mc (and the adjustment factor α) newly calculated in the cycle$_n$, etc., and the deviation in the previous and later cycles, etc. does not form a difference as a concept.

Further, while the embodiments exemplify those where the correction value of the most recent cycle is used in the calculation of the correction value of the applied cycle, this invention is not limited thereto. For example, a sufficient effect can be obtained by calculating the correction value of the applied cycle based on the correction value MC$_{n-2}$ which is two cycles before thereto and the correction value mc (and the adjustment factor α) newly calculated in the cycle$_n$.

The "applied cycle" indicates a cycle in which the updated correction value is used. Namely, the "an update process for updating the correction value is performed by a product of the correction value of a cycle before an applied cycle and a predetermined value for each predetermined cycle" is to update the correction value by the product of the correction value of the cycle (any number of cycles before thereto) before the applied cycle (cycle in which the updated correction value is used) and "predetermined value (values, etc. described in the embodiments)" for every predetermined cycle (cycle interval is arbitrary).

DESCRIPTION OF REFERENCE NUMERALS

100 . . . power control device
11 . . . output calculation unit
12 . . . current detection unit
13 . . . communication unit
21 . . . plate
31 . . . current detector
1 to 4 . . . load (heater)

The invention claimed is:

1. A power control device for controlling power supply to each of a plurality of loads in a system for heating or cooling a workpiece by the plurality of loads, the power control device comprising:
a current detector for measuring a combined current value wherein currents flowing through the plurality of loads are combined; and
an output calculation unit for calculating a correction value which is a value obtained by dividing a total value of a product of an operation output value for each of the loads and each rated current value of each of the loads by a combined current value obtained by the current detector, and controlling power supply to each of the loads based on a corrected operation output value which is a product of an operation output value for each of the loads and the correction value.

2. The power control device according to claim 1, wherein an update process for updating the correction value is performed by a product of the correction value of a cycle before an applied cycle and a predetermined value for each predetermined cycle.

3. The power control device according to claim 2, wherein the predetermined value is a value obtained by dividing a total value of a product of an operation output value for each of the loads and each rated current value of each of the loads by a combined current value obtained by the current detector.

4. The power control device according to claim 2, wherein the predetermined value is a value obtained by adding 1 to a product of a ratio of increase and decrease of the correction value and an adjustment factor.

5. The power control device according to claim 2, wherein the predetermined value is a sum of a value obtained by multiplying, by an adjustment factor, a value obtained by dividing a total value of a product of an operation output value for each of the loads and each rated current value of each of the loads by a combined current value obtained by the current detector, and a complement to the adjustment factor.

6. A power control method for controlling power supply to each of a plurality of loads in a system for heating or cooling a workpiece by the plurality of loads, the power control method comprising the steps of:
measuring a combined current value wherein currents flowing through the plurality of loads are combined;
calculating a correction value which is a value obtained by dividing a total value of a product of an operation output value for each of the loads and each rated current value of each of the loads by the combined current value; and
controlling power supply to each of the loads based on a corrected operation output value which is a product of an operation output value for each of the loads and the correction value.

* * * * *